(12) United States Patent
Misek et al.

(10) Patent No.: US 8,634,503 B2
(45) Date of Patent: Jan. 21, 2014

(54) FAST LOCK CLOCK-DATA RECOVERY FOR PHASE STEPS

(75) Inventors: Brian J. Misek, Fort Collins, CO (US); Robert K. Barnes, Fort Collins, CO (US); Peter J. Meier, Fort Collins, CO (US)

(73) Assignee: Avago Technologies General IP (Singapore) Pte. Ltd.

( * ) Notice: Subject to any disclaimer, the term of this patent is extended or adjusted under 35 U.S.C. 154(b) by 342 days.

(21) Appl. No.: 13/076,640

(22) Filed: Mar. 31, 2011

(65) Prior Publication Data

US 2012/0250811 A1  Oct. 4, 2012

(51) Int. Cl.
*H04L 27/00* (2006.01)

(52) U.S. Cl.
USPC ........... 375/326; 375/316; 375/354; 375/373; 375/376; 375/375; 327/141; 327/144; 327/146; 327/147; 327/155; 327/156

(58) Field of Classification Search
USPC ................. 375/326, 316, 354, 373, 376, 375; 327/141, 144, 146, 147, 155, 156
See application file for complete search history.

(56) References Cited

U.S. PATENT DOCUMENTS

| | | | |
|---|---|---|---|
| 7,439,816 B1 | 10/2008 | Lombaard | |
| 7,720,188 B2 | 5/2010 | Sanduleanu et al. | |
| 7,839,221 B2 | 11/2010 | Kossel et al. | |
| 2003/0131155 A1* | 7/2003 | Hsu et al. | 710/1 |
| 2007/0030936 A1* | 2/2007 | Johnson et al. | 375/371 |

OTHER PUBLICATIONS

Park, et al., "An Auto-Ranging 50-210Mb/s Clock Recovery Circuit with a Time-to-Digital Converter," 1999 International Solid-State Circuits Conference, IEEE, Feb. 17, 1999.
Hsieh, et al., "Architectures for Multi-Gigabit Wire-Linked Clock and Data Recovery," IEEE Circuits and Systems Magazine, IEEE, Fourth Quarter 2008.

* cited by examiner

*Primary Examiner* — Leila Malek

(57) ABSTRACT

A clock-data recovery system and method promotes fast adjustment to large phase changes in the incoming data signal. The system can include phase alignment circuitry, clock generator circuitry, time-to-digital converter circuitry, and sampling circuitry. The phase alignment circuitry uses the incoming data signal and a feedback clock signal to generate an output clock signal. The clock generator circuitry uses the output clock signal to generate base phase clock signals of different phases or polarities. The time-to-digital converter circuitry uses the base phase clock signals and the incoming data signal to generate the feedback clock signal. The time-to-digital converter circuitry bases the feedback clock signal on the base phase clock signal that is aligned more closely in phase with the incoming data signal than the other base phase clock signals. The sampling circuitry re-times or recovers the data signal using one or more of the base phase clock signals.

18 Claims, 7 Drawing Sheets

US 8,634,503 B2

FAST LOCK CLOCK-DATA RECOVERY FOR PHASE STEPS

BACKGROUND

Systems are known in which a high-speed serial data stream is transmitted without an accompanying clock signal. In a process known as clock-data recovery (CDR), the receiver recovers the data bits from the incoming data stream using signal transitions in the incoming data stream to regenerate or recover a clock signal. As illustrated in FIG. 1, a CDR system 10 in such a receiver may include phase-locked loop (PLL) circuitry 12 that comprises a phase detector 14, a loop filter 15, and a voltage-controlled oscillator (VCO) 16. The PLL circuitry 12 uses the incoming data stream (DATA) to generate an output clock signal (OUT), which is provided as feedback to phase detector 14. The output clock signal can be used to sample the data and thereby synchronize or re-time the data stream to the generated clock signal. Thus, both a clock signal and data synchronized with the clock signal are recovered from the incoming data stream.

Although FIG. 1 shows a single-loop CDR system 10, split-loop systems are also known. In a split-loop CDR system (not shown), a first path includes circuitry that phase-aligns the generated clock signal with the incoming data, while a second path includes circuitry that determines the frequency of the incoming data signal.

As further illustrated in FIG. 1, CDR system 10 includes a clock phase generator 18 that uses the output clock to generate several (e.g., four) additional clock signals, separated equally in phase from each other. A sampling circuit 20 uses the additional clock signals to sample the data bits. Using more than one clock signal to sample the data bits can provide more accurate results in sampling the signal levels and edges than if only a single clock signal were used.

The above-described PLL circuitry 12 generally maintains the recovered or re-generated (output) clock signal in alignment with, i.e., phase-locked to, the incoming data stream by making small adjustments to the phase of the output clock signal in response to small phase changes in the incoming data signal transitions. However, if PLL circuitry 12 experiences a large phase change in the incoming data stream, such as between 90 and 180 degrees, it may take an unacceptably long amount of time to re-lock the clock signal to the incoming data stream.

SUMMARY

Embodiments of the invention relate to a clock-data recovery system and method that promotes fast adjustment to large phase changes in the incoming data signal. In an exemplary embodiment, a system includes phase alignment circuitry, clock generator circuitry, time-to-digital converter circuitry, and sampling circuitry. The phase alignment circuitry uses the incoming data signal and a feedback clock signal to generate an output clock signal. The clock generator circuitry uses the output clock signal to generate a plurality of base phase clock signals of different phases or polarities. The time-to-digital converter circuitry uses the base phase clock signals and the incoming data signal to generate the feedback clock signal. The time-to-digital converter circuitry bases the feedback clock signal that it generates on the base phase clock signal that it determines is aligned more closely in phase with the incoming data signal than the other base phase clock signals. The sampling circuitry re-times or recovers the data signal using one or more of the base phase clock signals.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 2:
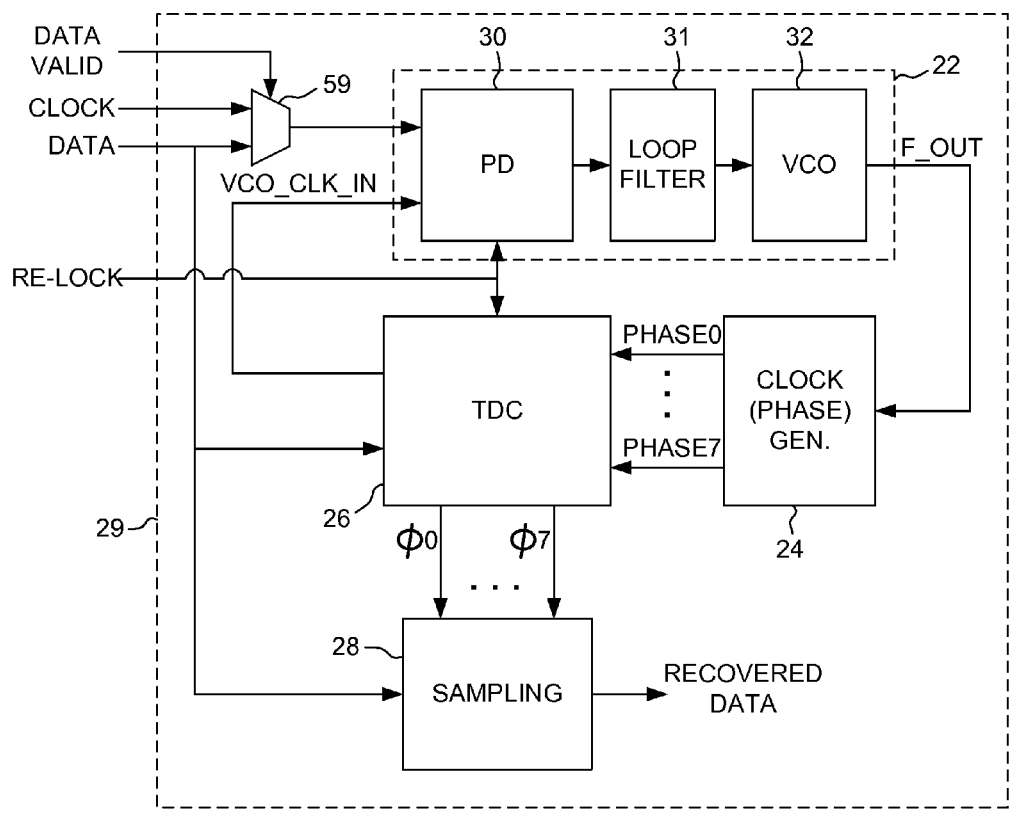
FIG. 2 is a circuit block diagram of CDR system in accordance with an exemplary embodiment of the invention.

As illustrated in FIG. 2, in an illustrative or exemplary embodiment of the invention, a CDR system includes phase alignment circuitry 22, clock generator circuitry 24, time-to-digital converter circuitry 26, and sampling circuitry 28. The CDR system can be included, for example, at the receiver end of a data communication link (not shown). The CDR system elements can be formed on the same integrated circuit chip 29 (i.e., a monolithic substrate) as each other. The CDR system elements can be formed on the same integrated circuit chip 29 as other elements associated with a receiver or transceiver (not shown). However, in other embodiments the CDR system elements can be distributed among several chips or devices.

As described below, in a normal operational state, incoming data (DATA) is received in serial format without an accompanying clock signal. The CDR system recovers or generates a clock signal from the incoming data stream and uses the recovered clock signal to sample the data stream and thereby re-time the recovered data bits in synchronism with the recovered clock signal. As described below in further detail, the CDR system can address instances in which the incoming data signal does not merely drift slightly in phase with respect to the recovered clock signal but rather jumps or steps in phase by a large amount, such as 90 degrees or more. Such instances can occur in a communication link in which, for example, the local receiver is capable of receiving transmissions from multiple remote transmitters. In an instance in which a remote transmitter begins a transmission immediately after another remote transmitter has completed a transmission, the CDR system in the local receiver may experience a large change in phase because the incoming data stream received from one remote transmitter may not be phase-aligned with the incoming data stream received from the other remote transmitter.

Phase alignment circuitry 22 is similar to conventional phase-locked loop circuitry in that it includes a phase detector 30, a loop filter 31, and a voltage-controlled oscillator (VCO) 32 and operates in response to a feedback clock signal (VCO_CLK_IN). Phase detector 30 produces an output representing phase error between the incoming data signal and the feedback clock signal. Voltage-controlled oscillator 32 produces an output clock signal (F_OUT) having a frequency f in response to the output of phase detector 30. In the general case, the clock generator circuitry generates n number of phases of clocks related to the output clock signal. In the exemplary embodiment, clock generator circuitry 24 uses the output clock signal to generate eight clock signals, each having the same frequency f as the output clock signal or an integer-divided version of the output clock signal. In the exemplary embodiment, in which the output clock signal is at the line rate, i.e., one complete cycle of VCO 32 occurs in a single bit time, denoted as F1, the output of clock generator circuitry 24 thus comprises eight phases of F1 divided by two, denoted as F2. These clock signals can be referred to for convenience as base phase clock signals PHASE0-PHASE7. Although in the exemplary embodiment there are eight such base phase clock signals, in other embodiments there can be any suitable set of two or more such base phase clock signals. The number of phases that are provided in an embodiment can be selected to set the limit on the residual phase error that the phase detector loop needs to correct after the exemplary circuitry selects a phase to output as the feedback clock signal (VCO_CLK_IN). In the exemplary embodiment, the use of four phases per F1 period limits the phase error to 90 degrees. In the exemplary embodiment, base phase clock signals PHASE0-PHASE3 differ in phase from each other, while base phase clock signals PHASE4-PHASE7 differ in phase from each other and are the complements of (i.e., opposite polarity of) base phase clock signals PHASE0-PHASE3. In other words, each of the base phase clock signals PHASE0-PHASE7 differs from the other base phase clock signals PHASE0-PHASE7 in either phase or polarity.

Time-to-digital converter circuitry 26 bases the feedback clock signal that it generates on the base phase clock signal that it determines is aligned more closely in phase with the incoming data signal than the other base phase clock signals. Thus, if the CDR system experiences a large change in phase in the incoming data signal, the feedback clock signal can be switched from being based on one of the base phase clock signals that is no longer closest in phase to the incoming data signal to another one of the base phase clock signals.

More specifically, in the exemplary embodiment four F2 clock phases are generated in both true and complement outputs. These eight F2 clock signals (i.e., the base phase clock signals) define a sequence, with each successive base phase clock signal in the sequence having a phase that is 45 degrees greater, relative to an F2 period being 360 degrees, than the previous base phase clock signal in the sequence, such that those four base phase clock signals are evenly distributed across half of one F2 clock cycle (1/f). Thus, for example, base phase clock signal PHASE7 is 45 degrees greater in phase than base phase clock signal PHASE6, which is 45 degrees greater in phase than base phase clock signal PHASE5, which is 45 degrees greater in phase than base phase clock signal PHASE4. As noted above, in the exemplary embodiment four of the eight base phase clock signals are the complements of the other four. Thus, base phase clock signal PHASE3 is the complement of base phase clock signal PHASE7; base phase clock signal PHASE2 is the complement of base phase clock signal PHASE6; base phase clock signal PHASE1 is the complement of base phase clock signal PHASE5; and base phase clock signal PHASE0 is the complement of base phase clock signal PHASE4. In sum, the eight base phase clock signals in the exemplary embodiment define a sequence, PHASE0 through PHASE7, with each successive base phase clock signal (PHASEn) in the sequence having an edge that is separated in phase by 45 degrees from the next base phase clock signal in the sequence, such that the base phase clock signal edges are evenly distributed across one full clock cycle (1/F2). In a case in which two complementary base phase clock signals may be equally close in phase to the incoming data signal, it is suitable to derive the feedback clock signal from either of them.

As described below in further detail, time-to-digital converter circuitry 26 produces a sequence or set of eight output phase clock signals ($\phi 0$-$\phi 7$), each corresponding to one of the base phase clock signals. For example, a phase relationship can be selected in the manner described below so that output phase clock signal $\phi 0$ corresponds to base phase clock signal PHASE0, output phase clock signal $\phi 1$ corresponds to base phase clock signal PHASE1, etc. The phases of the output phase clock signals are offset from each other by the same increment as the base phase clock signals, such as 45 degrees in the exemplary embodiment. However, each output phase clock signal and the base phase clock signal to which it corresponds may not at all times have the same phase as each other. This is because time-to-digital converter circuitry 26 can shift the entire set of eight output phase clock signals with respect to the set of base phase clock signals by an integer number of 45-degree steps. Thus, time-to-digital converter circuitry 26 effectively can select any one of the output phase clock signals to assume the same phase as any one of the base phase clock signals.

In the exemplary embodiment, time-to-digital converter circuitry 26 generates the feedback clock signal in response to one of the output phase clock signals, such as $\phi 0$. (In other embodiments, the feedback clock signal can be generated in response to any other suitable one or more of the output phase clock signals, or generated in any other suitable manner.) Time-to-digital converter circuitry 26 generates the feedback clock signal in response to the output phase clock signal $\phi 0$ by selecting the one of the base phase clock signals that is closest in phase to the incoming data signal and causing the output phase clock signal $\phi 0$ to assume the same phase as the selected base phase clock signal. An example of this operation of time-to-digital converter circuitry 26 is described below with regard to the timing diagram of FIGS. 3A-B.

Figure 3A:
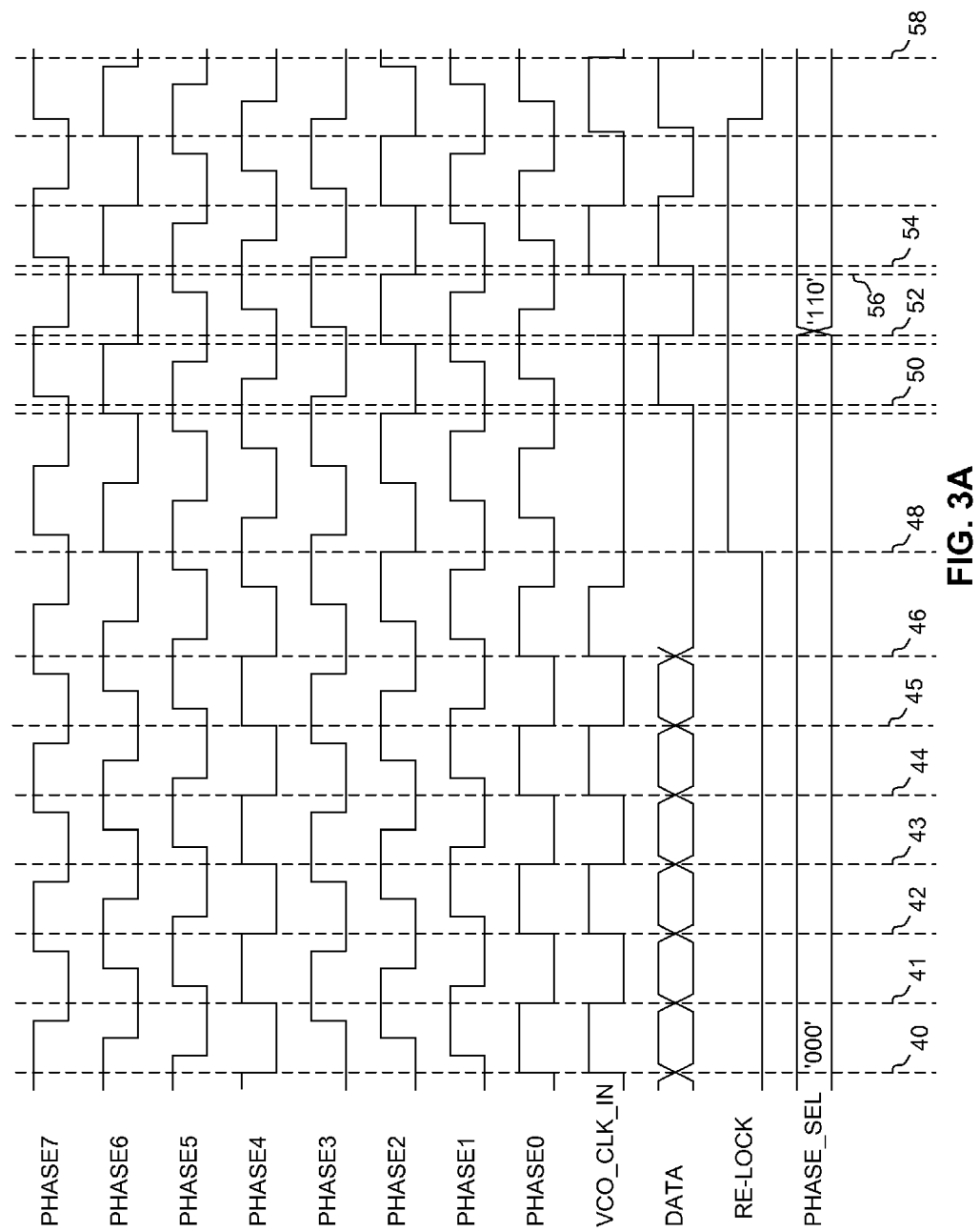
FIG. 3A is a timing diagram illustrating an exemplary instance of operation of the CDR system of FIG. 2.
Figure 3B:
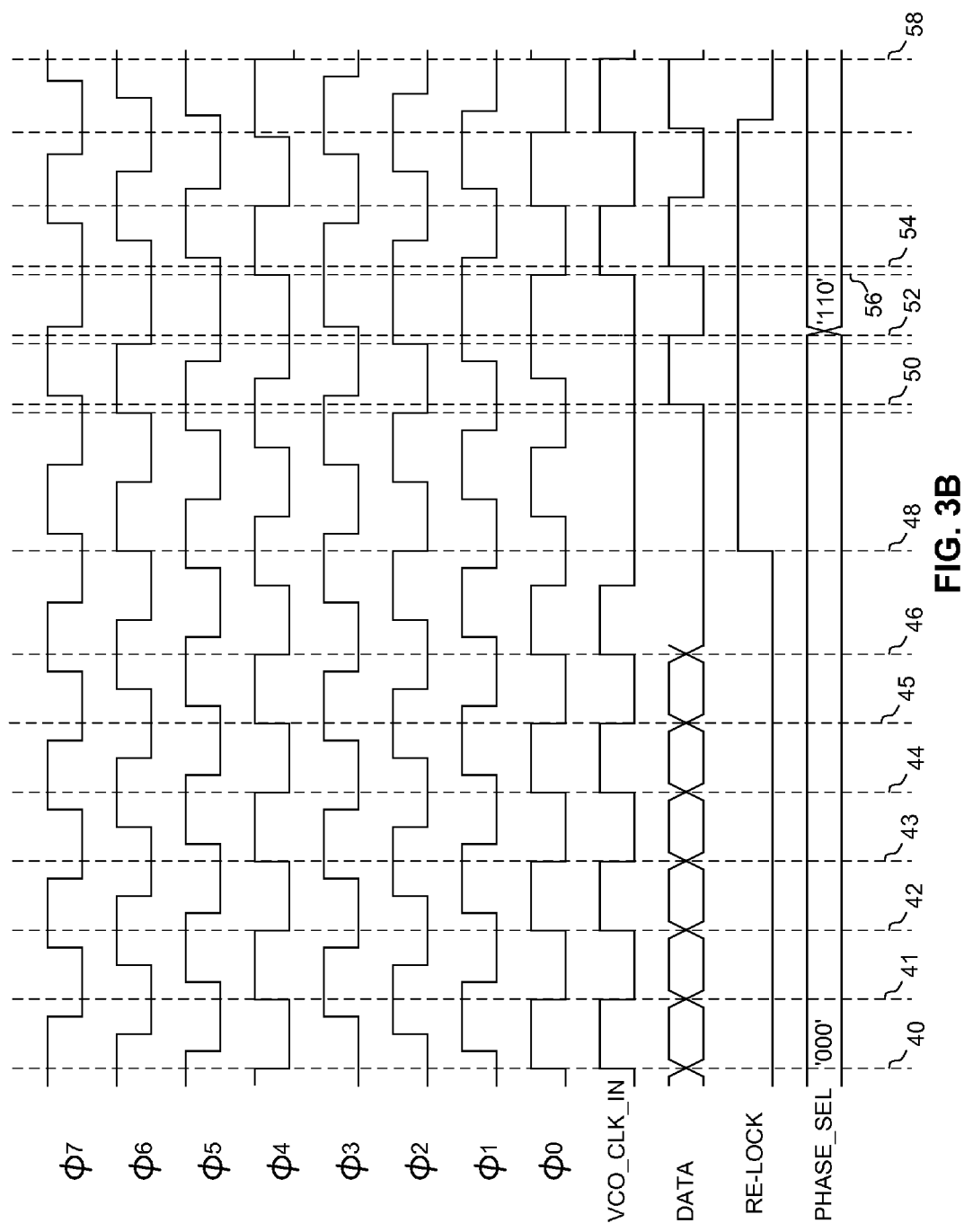
FIG. 3B is a continuation of the timing diagram of FIG. 3A.

As illustrated in FIGS. 3A-B, at timepoint 40 the incoming data signal (DATA) is shown as being phase-aligned with the feedback clock signal (VCO_CLK_IN). Note that the feedback clock signal is also phase-aligned with the base phase clock signal PHASE0, indicating that in this example the loop formed by phase alignment circuitry 22, clock generator circuitry 24, and time-to-digital converter circuitry 26, has achieved phase lock prior to timepoint 40. It can also be noted that at timepoint 40 the base phase clock signal PHASE0 is the one of the eight base phase clock signals that is closest in phase to the incoming data signal. The loop maintains this state of phase lock one half clock cycle later at timepoint 41, still another half clock cycle later at timepoint 42, and for the next several half clock cycles at timepoints 43, 44 and 45. Note that in the exemplary embodiment the incoming data can change at the F1 rate described above.

In the example illustrated in FIGS. 3A-B, the phase of the incoming data signal is shown as becoming indeterminate after timepoint 46 because, for example, it changes by a substantial amount that is sufficient to cause the CDR system to lose phase lock. For example, in an embodiment in which a remote transmitter (not shown) that was transmitting the data that the CDR system was receiving ceases its transmission after timepoint 46, the CDR system can cease phase updates and coast much like what persons skilled in the art can appreciate happens during long runs of consecutive digits. Also, for example, in a communications system (not shown) in which multiple remote transmitters define a corresponding number of channels, a local receiver with which the CDR system is associated may attempt to switch channels at timepoint 46, thus causing the CDR system to lose phase lock and requiring the CDR system to acquire phase lock with the transmission from another remote transmitter (i.e., representing another channel) at some point after timepoint 46.

In the exemplary embodiment, to indicate to the CDR system that phase lock is to be acquired (or re-acquired), a RE-LOCK signal and a data header are provided to the CDR system. The RE-LOCK signal can be generated, for example, by additional circuitry (not shown) of the local receiver with which the CDR system is associated, of the local transmitter with which the CDR system is associated, system management circuitry (not shown), or a combination of these sources. For example, in an instance in which such a local receiver switches channels as described above, the local receiver can generate the RE-LOCK signal at the time that it switches channels. The data header is generated by the remote transmitter (not shown) at the other end of the communication link In the example shown in FIGS. 3A-B, the RE-LOCK signal is asserted in this manner at a timepoint 48. As shown beginning at timepoint 50, the first incoming data to the CDR system following the assertion of the RE-LOCK signal comprises the data header. In the exemplary embodiment, the data header comprises a pattern of alternating "1"s and "0"s, i.e., high and low signal states. In other embodiments, the data header can comprise other patterns. Patterns can be selected with, for example, different decodes to optimize spectral energy in the header to match the characteristics of the phase detector used to enable optimum re-lock time. Thus, between timepoints 50 and 52 the incoming data signal ("DATA") is high, between timepoints 52 and 54 the incoming data signal is low, etc. The data header can comprise any suitable number of bits (i.e., clock cycles), such as, for example, four bits: 1010. As described below in further detail, time-to-digital converter 26 (FIG. 2) senses the first edge of the data header, such as the rising edge at timepoint 50 in the illustrated example, and uses the data header to help the CDR system achieve phase lock.

Time-to-digital converter circuitry 26 helps the CDR system achieve phase lock by selecting the one of the eight base phase clock signals (PHASE0-PHASE7) that is closest in phase to the incoming data signal and causing the output phase clock signal φ0 to assume the same phase as the selected base phase clock signal. After time-to-digital converter circuitry 26 selects the base phase clock signal, it asserts a phase select signal to indicate which of the eight base phase clock signals has been selected. In the example shown in FIGS. 3A-B, a three-bit phase select signal (PHASE_SEL) has a value of '000' (binary) prior to timepoint 52, indicating that the base phase clock signal closest in phase to the incoming data is base phase clock signal PHASE0. At timepoint 52 (aligned with a falling edge of the incoming data signal for reasons described below), the selected base phase clock signal changes from PHASE0 to PHASE6, as indicated by the transition of the phase select signal from '000' to '110'. Note that at timepoint 52 the base phase clock signal PHASE6 is the one of the eight base phase clock signals that is closest in phase to the incoming data signal. Accordingly, time-to-digital converter circuitry 26 causes the feedback clock signal (VCO_CLK_IN) to assume the phase of base phase clock signal PHASE6 following timepoint 52, beginning at timepoint 56 in this example. After timepoint 56, the loop formed by phase alignment circuitry 22, clock generator circuitry 24 and time-to-digital converter circuitry 26 drives the output clock signal toward phase lock. Phase lock is achieved in this example by timepoint 58, as the incoming data signal has become phase-aligned or phase-locked with the feedback clock signal. The RE-LOCK signal can be de-asserted at any suitable time, such as a few clock cycles after the beginning of the data header.

Once the CDR system achieves (or begins to achieve) phase lock with the data header, the incoming data signal can transition from the data header to actual data representing information to be recovered at the local receiver. The CDR system can maintain phase lock or continue to drive the output clock signal toward phase lock during the transition to actual data since the same remote transmitter that transmits the data header transmits the actual data that follows the data header.

Returning briefly to FIG. 2, to promote maintaining frequency lock at any time during which there is no incoming data to which the CDR system can lock phase, a locally generated F2 clock signal (CLOCK) can be substituted for the (absent) incoming data stream at the input to phase alignment circuitry 22. A multiplexer 59, switched between the incoming data stream and the locally generated clock signal in response to a data-valid signal, can be included for this purpose. The data-valid signal can be generated by other circuitry associated with the local receiver (not shown). As the local receiver can be included along with a local transmitter (not shown) as part of a local transceiver, the locally generated clock signal can be generated by such a local transmitter, acting as a master device. The locally generated clock signal can be used by the local transmitter to poll (i.e., transmit data representing an inquiry to) one or more remote receivers (not shown) acting as slave devices. A remote receiver can recover a clock signal from the data received from being polled, in a manner similar to that described herein with regard to the exemplary CDR system. In response to the polling, a remote transmitter (not shown) that is included along with the remote receiver as part of a remote transceiver can use the recovered clock signal to send data to the local receiver.

Figure 4:
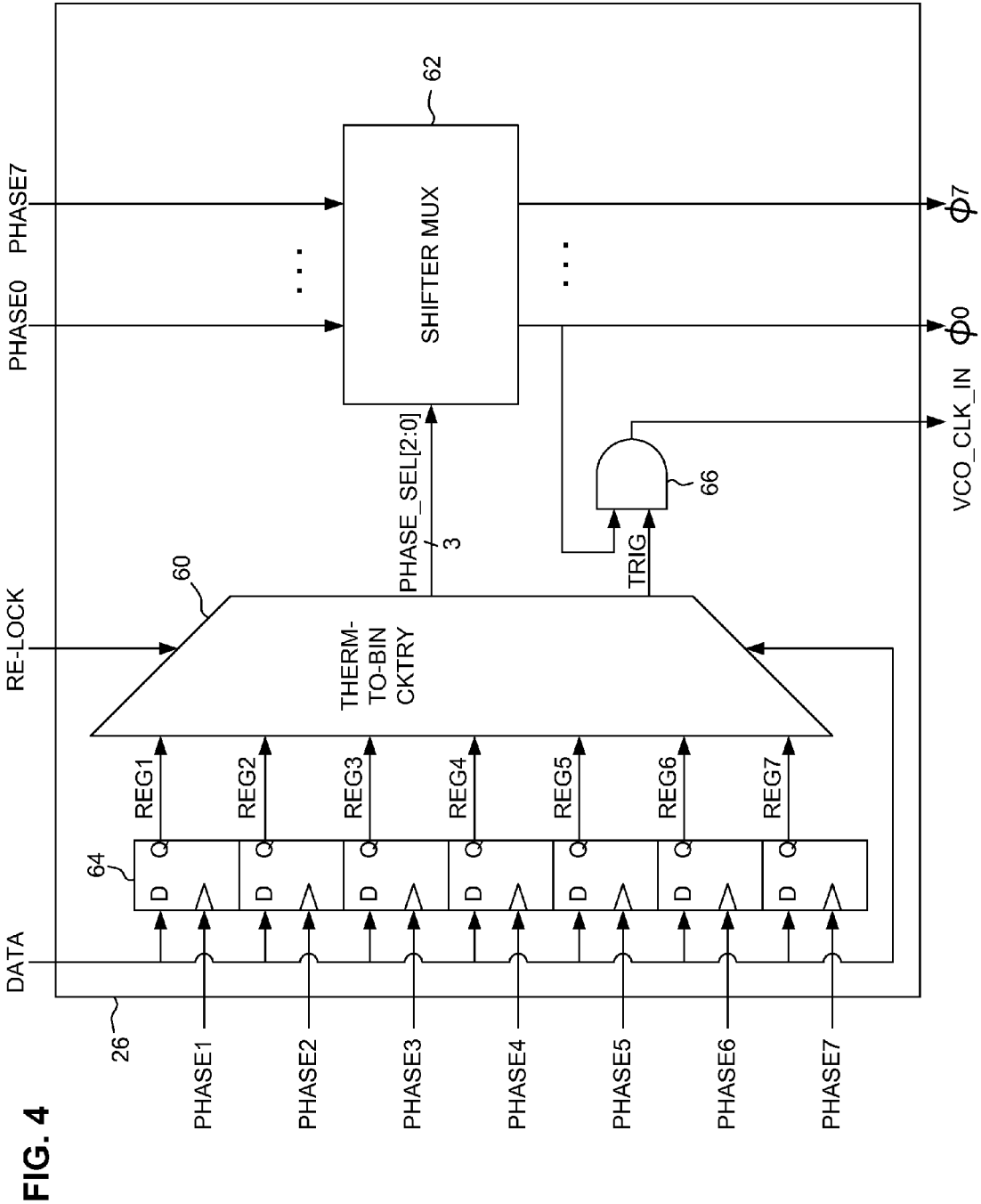
FIG. 4 is a circuit block diagram the time-to-digital converter (TDC) of the CDR system of FIG. 2.

As illustrated in FIG. 4, an exemplary time-to-digital converter circuitry 26 can include a thermometer code-to-binary converter 60 and a shifter multiplexer 62. The incoming data is clocked into a 7-bit register 64 that provides seven latched data bits (REG1-REG7) to thermometer code-to-binary converter 60. Each of the base phase clock signals PHASE1 through PHASE7 is provided to one of the clock inputs of register 64 to trigger the latching of the corresponding input bits REG1-REG7. Note that the base phase clock signal PHASE0 is not latched, because it is not needed by thermometer code-to-binary converter 60. However, to equalize signal loading in a circuit, it may be useful in some embodiments to latch base phase clock signal PHASE0, even though the latched signal would not be provided as an input to thermometer code-to-binary converter 60. In response to the latched data bits, thermometer code-to-binary converter 60 generates the above-described phase select signal. In response to the phase select signal and the base phase clock signals PHASE0-PHASE7, shifter multiplexer 62 generates the output phase clock signals φ0-φ7.

The feedback clock (VCO_CLK_IN) is a qualified version of the output phase clock signal φ0. An AND gate 66 is included for enabling the output phase clock signal φ0 using a signal TRIG, which, as described below, is asserted in response to the first falling edge of the incoming data signal after the RE-LOCK signal has been asserted. Accordingly, in the example described above, the feedback clock signal is held low until timepoint 56 (FIGS. 3A-B). Holding the feedback clock signal low until the first falling edge of the incoming data after the RE-LOCK signal has been asserted provides sufficient time for the newly selected base phase clock signal to propagate through shifter multiplexer 62 and become the output phase clock signal φ0. (That is, output phase clock signal φ0 assumes the phase of the selected base phase clock signal.) Note that the output phase clock signals φ0-φ7 are used by sampling circuit 20 to sample the signal levels and edges of the incoming data signal in a conventional manner.

Figure 5:
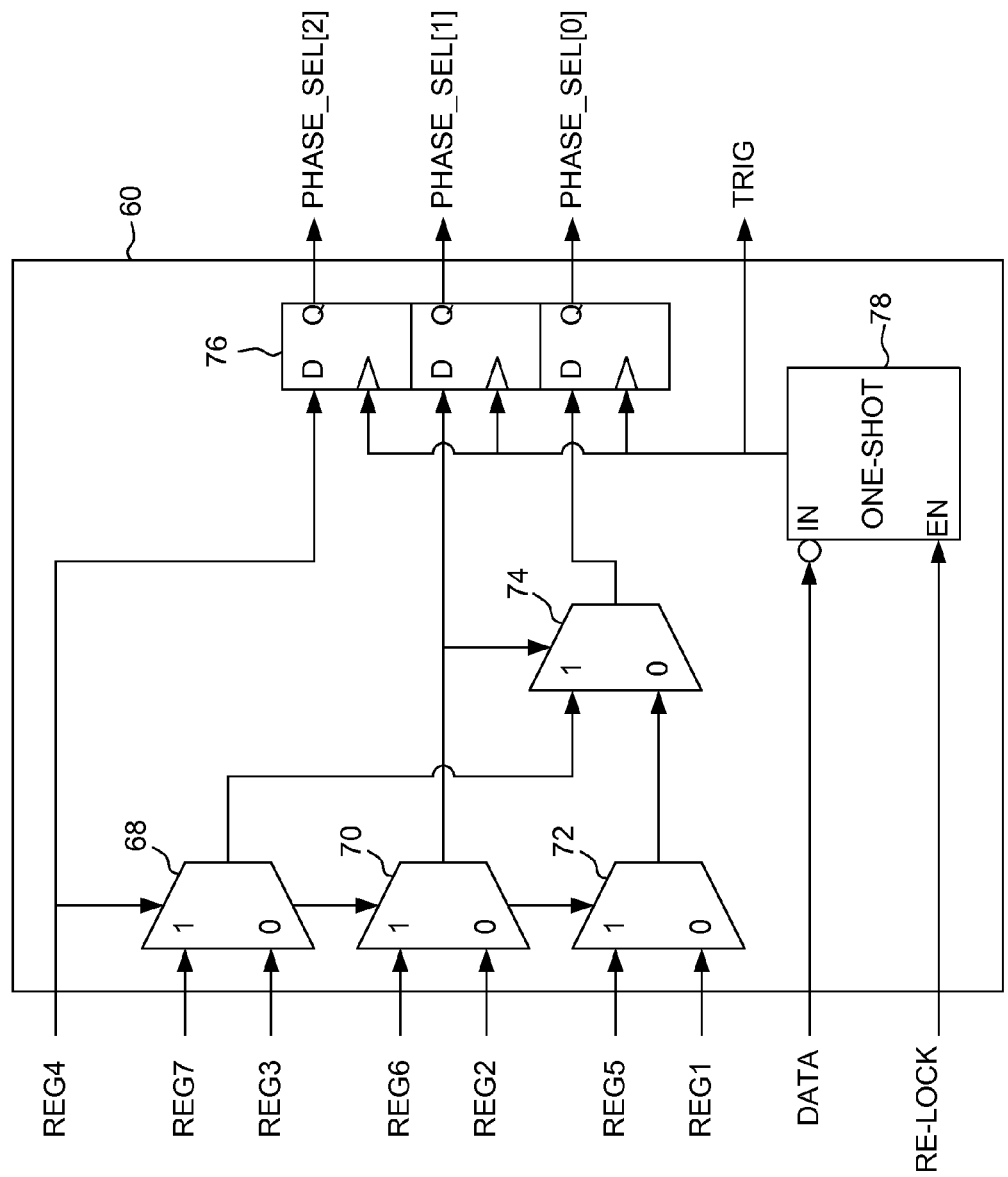
FIG. 5 is a circuit block diagram of the thermometer code-to-binary code converter circuitry of the TDC of FIG. 4.

As illustrated in FIG. 5, an exemplary thermometer code-to-binary converter 60 can comprise a number of multiplexers 68, 70, 72 and 74 and a 3-bit register 76. In the illustrated thermometer code-to-binary converter 60, the latched data bit REG4 becomes the most-significant bit of the phase select signal, PHASE_SEL[2], because it represents the middle data bit in the array REG1-REG7. The latched data bit REG4 also controls multiplexers 68, 70 and 72. In response to REG4, multiplexer 68 selects one of REG1 and REG3; multiplexer 70 selects one of REG6 and REG2; and multiplexer 72 selects one of REG5 and REG1. The output of multiplexer 70 becomes the next bit of the phase select signal, PHASE_SEL[1]. Multiplexer 74 is controlled by the output of multiplexer 70. In response to the output of multiplexer 70, multiplexer 74 selects one of the outputs of multiplexers 68 and 72. The output of multiplexer 74 becomes the least-significant bit of the phase select signal, PHASE_SEL[0]. Those skilled in the art will realize that in other embodiments phases can be selected in other ways. For example, in another embodiment (not shown) the time-to-digital converter circuitry can use the shifted clock signals as an input, and the circuitry can keep track of the previous phase select signal and add it to the new phase select signal. In an embodiment using eight clock phases, the lower three bits of the result of this addition would be used.

As converting thermometer-coded data into binary-coded data is well understood in the art, persons skilled in the art to which the invention relates can appreciate that thermometer code-to-binary converter 60 is merely an example, and various other thermometer code-to-binary converter circuits will readily occur to those skilled in the art in view of the teachings herein. For example, persons skilled in the art can appreciate that economy in the number of circuit elements included in a thermometer code-to-binary converter can be promoted by taking advantage of the fact that the base phase clock signals PHASE0-PHASE3 are the complements of base phase clock signals PHASE4-PHASE7 in the exemplary embodiment. In should be noted, however, that in other embodiments the set of phase clocks need not include any that are complements of each other.

The latched data bit REG4 becomes the most-significant bit of the phase select signal, PHASE_SEL[2], after it is latched in register 76. Likewise, the output of multiplexer 70 becomes the next bit of the phase select signal, PHASE_SEL[1], after it is latched in register 76. Similarly, the output of multiplexer 74 becomes the least-significant bit of the phase select signal, PHASE_SEL[0], after it is latched in register 76. Register 76 is clocked by the output of a one-shot circuit 78. One shot circuit 78 serves the above-described purpose of providing a latching or trigger signal (TRIG) when the first falling edge of the incoming data after the RE-LOCK signal has been asserted occurs.

Figure 6:
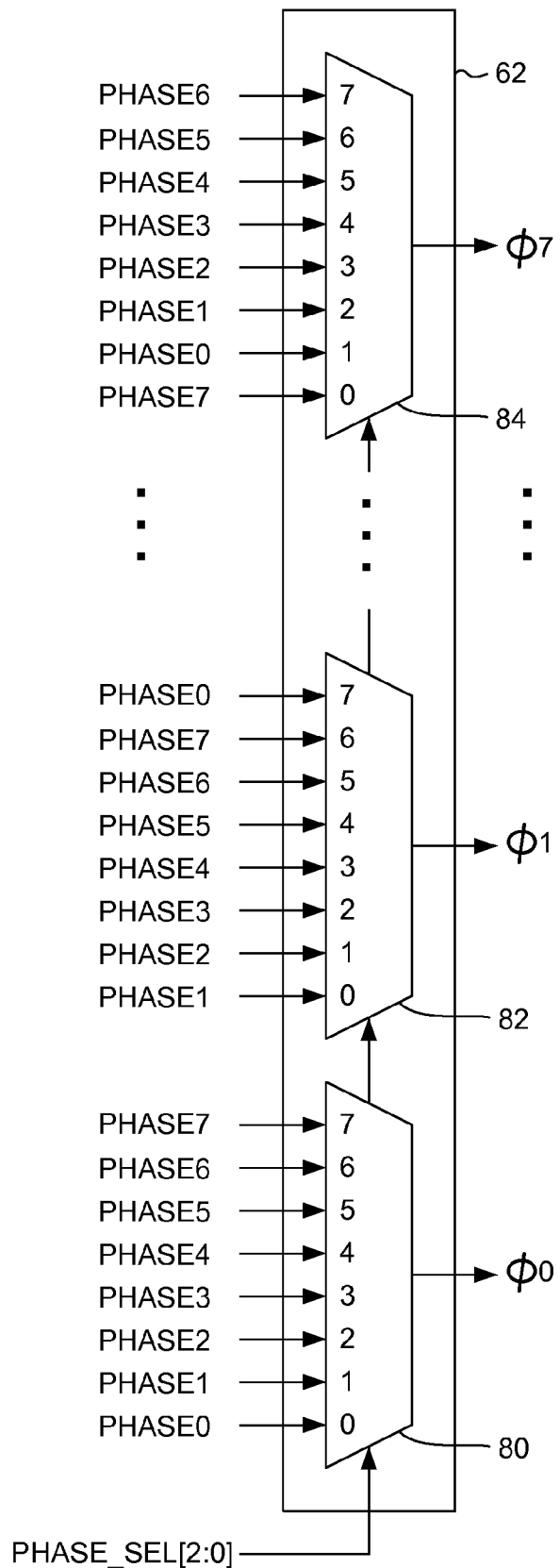
FIG. 6 is a circuit block diagram of the shifter multiplexer of the TDC of TDC of FIG. 4.

As illustrated in FIG. 6, an exemplary shifter multiplexer 62 can comprise eight multiplexers 80, 82, 84, etc. (with those that are not shown for purposes of clarity being represented by the ellipsis ("...") symbol). Each of multiplexers 80, 82, 84, etc., is controlled by the phase select signal (PHASE_SEL [2:0]). Each of multiplexers 80, 82, 84, etc., has eight multiplexed inputs that correspondingly receive a set of the base phase clock signals. Each of multiplexers 80, 82, 84, etc., provides one of the output phase clock signals φ0, φ1, φ2, etc. The set of base phase clock signals provided to each of multiplexers 80, 82, 84, etc., is shifted in a circular manner from the sets provided to the others of multiplexers 80, 82, 84, etc. In accordance with this scheme, the set of base phase clock signals in a first sequence PHASE0, PHASE1, PHASE2, etc., through PHASE7 is provided to the correspondingly indexed inputs of multiplexer 80, which selects one of those phase signals to become the corresponding phase signal φ0 in response to the phase select signal. In further accordance with this scheme, the set of base phase clock signals in a second sequence PHASE1, PHASE2, PHASE3, etc., through PHASE0 is provided to the correspondingly indexed inputs of multiplexer 80, which selects one of those phase signals to become the corresponding phase signal φ1 in response to the phase select signal. The scheme continues in this pattern, with sets of base phase clock signals in third, fourth, fifth, sixth and seventh sequences being provided to the multiplexers that are not shown, until the last set of base phase clock signals in an eighth sequence PHASE7, PHASE0, PHASE1, etc., through PHASE6 is provided to the inputs of multiplexer 84, which selects one of those phase signals to become the corresponding phase signal φ7 in response to the phase select signal. Thus, shifter multiplexer 62 causes each of corresponding phase signals φ0-φ7 to assume the phase of one of phase signals PHASE0-PHASE7 in response the phase select signal.

Figure 7:
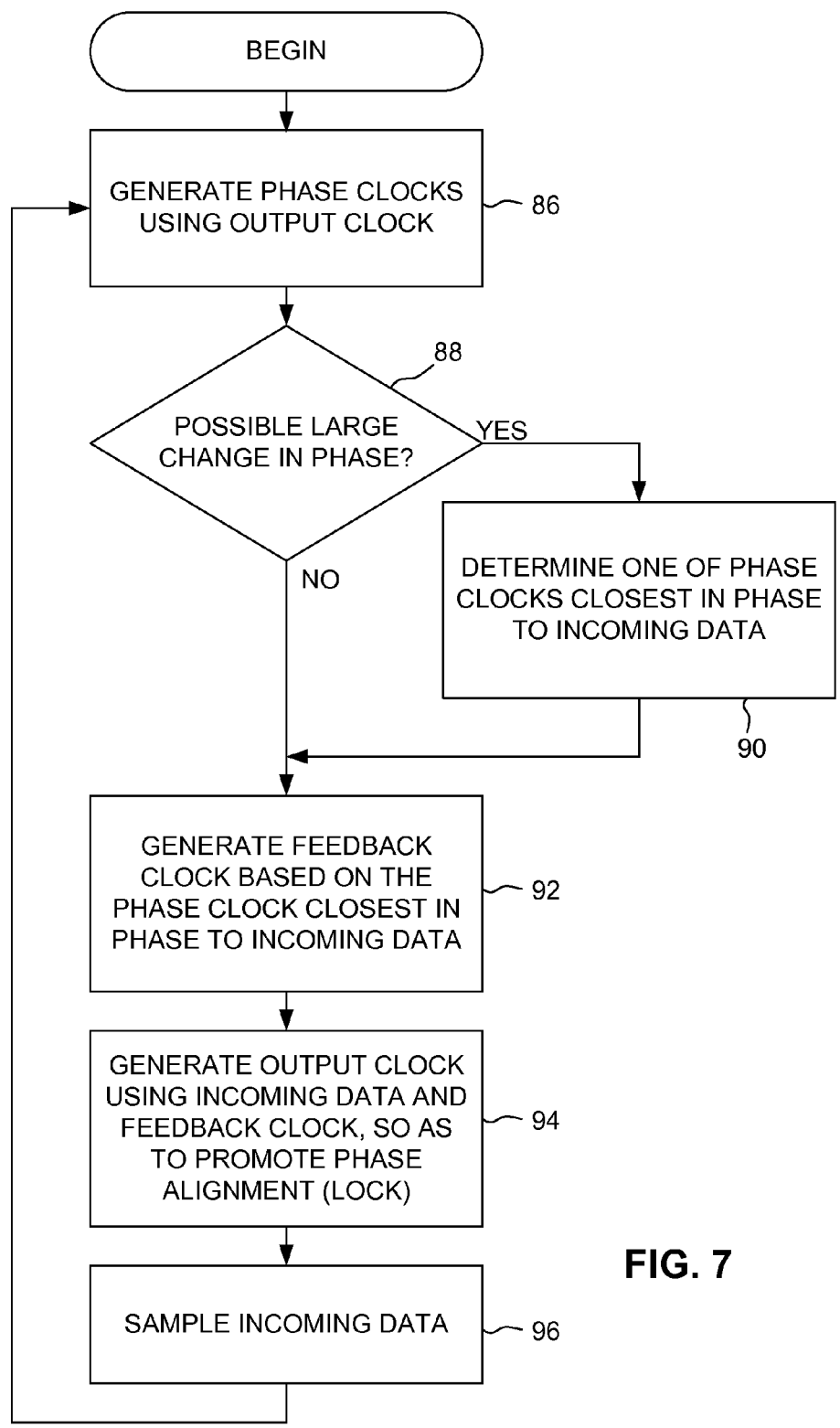
FIG. 7 is a flow diagram illustrating a method of operation of the CDR system of FIG. 2.

The operation of CDR system 10 can be described more broadly with reference to the flow diagram of FIG. 7. As indicated by block 86, a set or plurality of phase clock signals is generated in response to the output clock signal. As indicated by block 88, a possible large change in phase between the incoming data and the output clock signal can be detected by, for example, detecting assertion of RE-LOCK signal or other signal. If it is determined that a possible large change in phase is occurring or has occurred, then the phase clock that is closest in phase to the incoming data is determined, as indicated by block 90. In an embodiment in which a data header follows assertion of the RE-LOCK signal, the data header can be used to determine the phase clock that is closest in phase to the incoming data. As indicated by block 92, a feedback clock is generated based on the phase clock that is closest in phase to the incoming data. As indicated by block 94, the feedback clock and incoming data are used in a feedback loop to phase-align the output clock with the incoming data. As indicated by block 96, one or more of the phase clocks can be used to sample the incoming data, thereby producing the recovered data.

Figure 1:
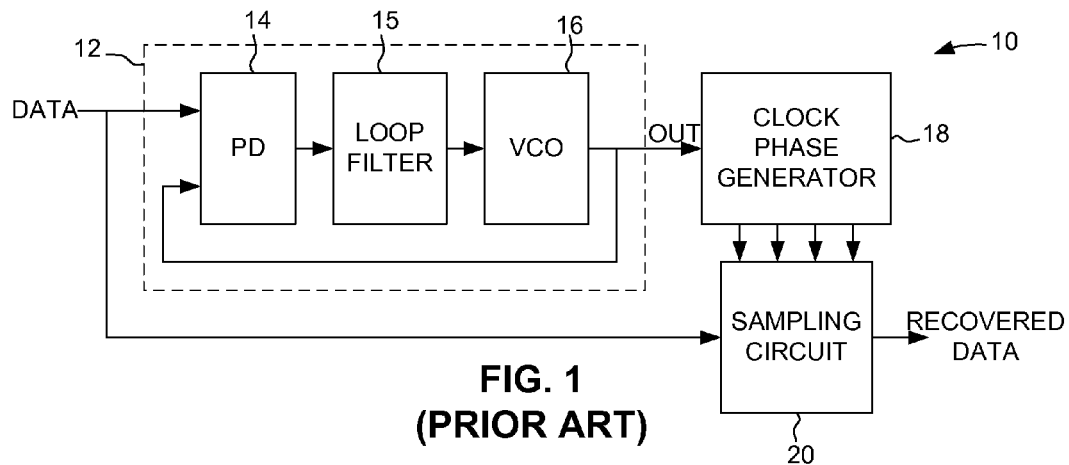
FIG. 1 is a circuit block diagram of a conventional clock-data recovery (CDR) system, in accordance with the prior art.

The above-described circuit elements can be provided in any suitable manner, such as by forming microelectronic structures on a monolithic substrate 29 (FIG. 1) that serve as means for performing the functions described above with respect to those circuit elements. Conventional photolithographic and other microelectronic techniques can be used to form such structures, as well understood by persons skilled in the art.

One or more illustrative or exemplary embodiments of the invention have been described above. However, it is to be understood that the invention is defined by the appended claims and is not limited to the specific embodiments described.

What is claimed is:

1. A clock-data recovery system, comprising:
    phase alignment circuitry generating an output clock signal in response to an incoming data signal and a feedback clock signal;
    clock generator circuitry generating a plurality of base phase clock signals in response to the output clock signal, each base phase clock signal of the plurality of base phase clock signals differing in at least one of phase and polarity from all other base phase clock signals of the plurality of base phase clock signals and having a frequency the same as the frequency of all other base phase clock signals of the plurality of base phase clock signals;
    time-to-digital converter circuitry generating the feedback clock signal in response to the incoming data signal and the plurality of base phase clock signals and in response to assertion of a re-lock signal indicating a large change in phase between the incoming data signal and the output clock signal, the time-to-digital converter circuitry basing the feedback clock signal on one of the plurality of base phase clock signals aligned more closely in phase with the incoming data signal than others of the plurality of base phase clock signals; and
    sampling circuitry generating a recovered data signal in response to at least one of the plurality of base phase clock signals.

2. The clock-data recovery system of claim 1, wherein the time-to-digital converter circuitry generates the feedback clock signal further in response to a data header encoded in the incoming data signal following assertion of the re-lock signal.

3. The clock-data recovery system of claim 1, wherein the time-to-digital converter circuitry bases the feedback clock signal on one of the plurality of base phase clock signals by generating a plurality of output phase clock signals corresponding to the base phase clock signals but shiftable in phase from the plurality of base phase clock signals, and wherein the feedback clock signal is generated in response to one of the output phase clock signals.

4. The clock-data recovery system of claim 3, wherein the time-to-digital converter circuitry comprises:
    a thermometer code-to-binary code converter generating a phase select signal in response to at least a subset of the plurality of base phase clock signals; and
    a shifter multiplexer generating the output phase clock signals in response to the base phase clock signals and the phase select signal, the phase select signal indicating one of the output phase clock signals to select as the feedback clock signal.

5. The clock-data recovery system of claim 3, wherein:
    the plurality of output phase clock signals consists of eight output phase clock signals; and
    the plurality of base phase clock signals consists of eight base phase clock signals.

6. The clock-data recovery system of claim 3, wherein:
    the plurality of output phase clock signals comprises a sequence of clock signals increasing in phase by a uniform phase increment; and
    the plurality of base phase clock signals comprises a sequence of clock signals increasing in phase by the uniform phase increment.

7. The clock-data recovery system of claim 3, wherein the phase alignment circuitry comprises a phase detector, a loop filter and a voltage-controlled oscillator, the phase detector producing an output in response to the incoming data signal and the feedback clock signal, the loop filter producing an output in response to the output of the phase detector, and the voltage-controlled oscillator producing the output clock signal in response to the output of the loop filter.

8. The clock-data recovery system of claim 3, wherein the sampling circuitry generates the recovered data signal in response to the plurality of output phase clock signals.

9. A clock-data recovery method, comprising:
    generating an output clock signal in response to an incoming data signal and a feedback clock signal;
    generating a plurality of base phase clock signals in response to the output clock signal, each base phase clock signal of the plurality of base phase clock signals differing in at least one of phase and polarity from all other base phase clock signals of the plurality of base phase clock signals and having a frequency the same as the frequency of all other base phase clock signals of the plurality of base phase clock signals;
    generating the feedback clock signal in response to the incoming data signal and the plurality of base phase clock signals and in response to assertion of a re-lock signal indicating a large change in phase between the incoming data signal and the output clock signal by basing the feedback clock signal on one of the plurality of base phase clock signals aligned more closely in phase with the incoming data signal than others of the plurality of base phase clock signals; and
    generating a recovered data signal in response to at least one of the plurality of base phase clock signals.

10. The clock-data recovery method of claim 9, wherein generating the feedback clock signal comprises generating the feedback signal in response to a data header encoded in the incoming data signal following assertion of the re-lock signal.

11. The clock-data recovery method of claim 9, wherein the feedback clock signal is based on one of the plurality of base phase clock signals by generating a plurality of output phase clock signals corresponding to the base phase clock signals but shiftable in phase from the plurality of base phase clock signals, and wherein the feedback clock signal is generated in response to one of the output phase clock signals.

12. The clock-data recovery method of claim 11, wherein generating the feedback clock signal comprises:
    generating a phase select signal in response to at least a subset of the plurality of base phase clock signals; and
    generating the output phase clock signals in response to the base phase clock signals and the phase select signal, the phase select signal indicating one of the output phase clock signals to select as the feedback clock signal.

13. The clock-data recovery method of claim 11, wherein:
    the plurality of output phase clock signals consists of eight output phase clock signals; and
    the plurality of base phase clock signals consists of eight base phase clock signals.

14. The clock-data recovery method of claim 11, wherein:
    the plurality of output phase clock signals comprises a sequence of clock signals increasing in phase by a uniform phase increment; and
    the plurality of base phase clock signals comprises a sequence of clock signals increasing in phase by the uniform phase increment.

15. The clock-data recovery method of claim 11, wherein generating the recovered data signal occurs in response to the plurality of output phase clock signals.

16. An integrated circuit device including a clock-data recovery system, comprising a monolithic substrate on which is formed:
    means for generating an output clock signal in response to an incoming data signal and a feedback clock signal;

means for generating a plurality of base phase clock signals in response to the output clock signal, each base phase clock signal of the plurality of base phase clock signals differing in at least one of phase and polarity from all other base phase clock signals of the plurality of base phase clock signals and having a frequency the same as the frequency of all other base phase clock signals of the plurality of base phase clock signals;

means for generating the feedback clock signal in response to the incoming data signal and the plurality of base phase clock signals and in response to assertion of a re-lock signal indicating a large change in phase between the incoming data signal and the output clock signal, the means for generating the feedback clock signal basing the feedback clock signal on one of the plurality of base phase clock signals aligned more closely in phase with the incoming data signal than others of the plurality of base phase clock signals; and means for generating a recovered data signal in response to at least one of the plurality of base phase clock signals.

17. The integrated circuit device of claim 16, wherein the means for generating the feedback clock signal bases the feedback clock signal on one of the plurality of base phase clock signals by generating a plurality of output phase clock signals corresponding to the base phase clock signals but shiftable in phase from the plurality of base phase clock signals, and wherein the feedback clock signal is generated in response to one of the output phase clock signals.

18. The integrated circuit device of claim 17, wherein the means for generating the feedback clock signal comprises:

means for generating a phase select signal in response to at least a subset of the plurality of base phase clock signals; and means for generating the output phase clock signals in response to the base phase clock signals and the phase select signal, the phase select signal indicating one of the output phase clock signals to select as the feedback clock signal.

* * * * *